(12) United States Patent
Lai et al.

(10) Patent No.: US 9,953,560 B2
(45) Date of Patent: Apr. 24, 2018

(54) DISPLAY DEVICE WITH SOLAR CELL MODULE

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Weilin Lai, Beijing (CN); Renrong Gai, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 15/071,764

(22) Filed: Mar. 16, 2016

(65) Prior Publication Data
US 2017/0061856 A1 Mar. 2, 2017

(30) Foreign Application Priority Data

Sep. 1, 2015 (CN) .......................... 2015 1 0551449

(51) Int. Cl.
*G09G 3/20* (2006.01)
*G09G 3/3208* (2016.01)
(Continued)

(52) U.S. Cl.
CPC ......... *G09G 3/2092* (2013.01); *G09G 3/3208* (2013.01); *H01L 31/02021* (2013.01);
(Continued)

(58) Field of Classification Search
CPC .............. G09G 3/2092; G09G 3/3208; G09G 2330/023; G09G 2360/144; H02J 7/355; H02S 40/36; H01L 31/02021; Y02E 10/50
See application file for complete search history.

(56) References Cited

U.S. PATENT DOCUMENTS

2010/0060669 A1 3/2010 Cheng
2012/0082012 A1* 4/2012 Blanckaert ............. G04B 19/32
368/224
(Continued)

FOREIGN PATENT DOCUMENTS

CN 101673514 A 3/2010
CN 102075595 A 5/2011
(Continued)

OTHER PUBLICATIONS

First Office Action regarding Chinese Application No. 201510551449.1, dated Jun. 27, 2017. Translation provided by Dragon Intellectual Property Law Firm.
(Continued)

*Primary Examiner* — Kwang-Su Yang
(74) *Attorney, Agent, or Firm* — Harness, Dickey & Pierce, P.L.C.

(57) ABSTRACT

The present disclosure provides a display device. A solar cell module is integrated into a body of the display device. A photosensitive control module is configured to detect a brightness value of current ambient light being incident on the display device, and when the detected brightness value meets a predetermined condition, switch a power supply of the display device from a local cell to the solar cell module, so as to supply the electric energy stored in the solar cell module to the display device.

16 Claims, 4 Drawing Sheets

(51) Int. Cl.
H02S 40/36 (2014.01)
H01L 31/02 (2006.01)
H02J 7/35 (2006.01)

(52) U.S. Cl.
CPC ....... *H02S 40/36* (2014.12); *G09G 2330/023* (2013.01); *G09G 2360/144* (2013.01); *H02J 7/355* (2013.01); *Y02E 10/50* (2013.01)

(56) References Cited

U.S. PATENT DOCUMENTS

2014/0223201 A1* 8/2014 Chew .................. G06F 1/1635
                                                    713/300
2017/0162812 A1* 6/2017 Aoki .................... H01L 51/448

FOREIGN PATENT DOCUMENTS

| CN | 103019422 A | 4/2013 |
|----|-------------|--------|
| CN | 103108079 A | 5/2013 |
| CN | 103258841 A | 8/2013 |
| CN | 103728753 A | 4/2014 |
| CN | 104571698 A | 4/2015 |

OTHER PUBLICATIONS

Second Office Action regarding Chinese Application No. 201510551449.1, dated Dec. 13, 2017. Translation provided by Dragon Intellectual Property Law Firm.

* cited by examiner

DISPLAY DEVICE WITH SOLAR CELL MODULE

CROSS-REFERENCE TO RELATED APPLICATION

The present application claims a priority of the Chinese patent application No. 201510551449.1 filed on Sep. 1, 2015, which is incorporated herein by reference in its entirety.

TECHNICAL FIELD

The present disclosure relates to the field of display technology, in particular to a display device.

BACKGROUND

In our daily lives, such electronic display devices as mobile phones and tablet computers have become indispensable devices for communication and entertainment. However, the capacity for a local cell of the electronic display device is limited. When the electronic display device has been used for a period of time, the cell power may be lowered to a level insufficient to operate the display device. For example, when the cell power for a mobile phone is insufficient, it is unable to make an emergency call. At this time, when a user is in the open air or at any other place where no electric supply is available, it is impossible to charge the local cell in time.

Thus, a new display device is desiderated, so as to overcome the above-mentioned drawback.

SUMMARY

An object of the present disclosure is to provide a display device, so as to ensure a normal operation of the display device when the power of the local cell is used up.

The present disclosure provides in some embodiments a display device, including a body including a display panel, a local cell, and a solar cell module and a photosensitive control module arranged on the body. The solar cell module is configured to receive ambient light, convert light energy into electric energy, and store the electric energy. The photosensitive control module is configured to detect a brightness value of the current ambient light, and when the brightness value meets a predetermined condition, switch a power supply of the display device from the local cell to a solar cell module.

Alternatively, the solar cell module includes at least two solar cells connected in series and/or connected in parallel.

Alternatively, the solar cell module is arranged at a bezel region of the display panel and/or at a surface of a back plate of the display device.

Alternatively, when the solar cell module is arranged at the bezel region, an ink-printed film coated on the bezel region is a transparent film or a non-transparent film with a plurality of apertures.

Alternatively, the photosensitive control module is a photosensitive control element.

Alternatively, the photosensitive control element is a photosensitive switch.

Alternatively, the predetermined condition is that the brightness value of the ambient light is not less than a predetermined threshold.

Alternatively, the predetermined threshold is a minimum brightness value of the ambient light in the case that the following condition can be met: a total amount of the electric energy converted by the solar cell module from the ambient light in unit time is not less than the power consumption of the display device in the unit time.

Alternatively, the display panel is an organic light-emitting diode (OLED) display panel.

Alternatively, the solar cell is a single crystalline silicon solar cell, a nanocrystalline silicon solar cell, an organic solar cell, or an electrode-type solar cell modified with multiple polymer layers.

According to the embodiments of the present disclosure, the solar cell module is arranged on the body of the display device, and the photosensitive control module is configured to detect the brightness value of the current ambient light. When the brightness value of the current ambient light meets the predetermined condition, the power supply of the display device is switched from the local cell to the solar cell module. As a result, it is able to save the cell power of the local cell, and prolong a standby time of the display device. In addition, in the case that the display device cannot operate normally when the cell power of the local cell is used up, it is able to maintain the normal operation of the display device using the electric energy converted by, and stored in, the solar cell module in real time.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Solar cell is an element for directly converting solar energy into electric energy on the basis of a photoelectric conversion effect. The solar energy, as primary and renewable energy, is abundant in nature and environmentally friendly, without any logistical support, so it is one of the cleanest energy sources. There are various solar cells, such as nanocrystalline solar cell, organic solar cell, electrode-type solar cell modified with multiple polymer layers, and silicon solar cell. Among them, the silicon solar cell is currently the most mature one and becomes a leading solar cell due to its advantages such as high conversion efficiency, long service life and stable operation.

The present disclosure will be described hereinafter in conjunction with the drawings and embodiments. Obviously, the following embodiments are for illustrative purposes, but shall not be used to limit the scope of the present disclosure.

Figure 1:
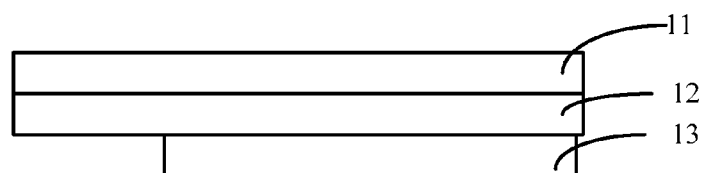
FIG. 1 is a sectional view of a display device according to one embodiment of the present disclosure.

As shown in FIG. 1, which is a sectional view of a display device according to one embodiment of the present disclosure, the display device includes a body mainly consisting of a display panel 11 and a display module 12, and a local cell 13. The display module 12 includes a driver circuit and a control circuit (not shown), and the local cell 13 is configured to apply a voltage to the display module 12, so as to drive and control the display panel 11.

Figure 2:
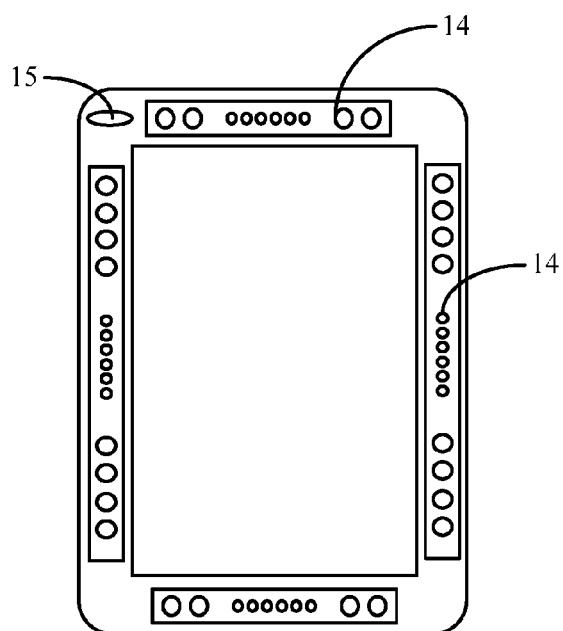
FIG. 2 is a top view of the display device according to one embodiment of the present disclosure.

As shown in FIG. 2, the display device further includes a solar cell module 14 and a photosensitive control module 15 arranged on the body. Usually, the solar cell module 14 is arranged at a region other than a display region, and configured to receive ambient light, convert light energy into electric energy, and store the electric energy, e.g., in an accumulator of the solar cell module. The photosensitive control module 15 is configured to detect a brightness value of current ambient light of the ambient where the display device is located, and when the detected brightness value meets a predetermined condition, switch a power supply of the display device from the local cell 13 to the solar cell module 14.

According to the embodiments of the present disclosure, the solar cell module and the photosensitive control module are integrated into the display device. Through the solar cell module, the display device can consistently receive the ambient light in an environment such as in the open air, convert the light energy into the electric energy, and store the electric energy in the accumulator of the solar cell module. Meanwhile, the photosensitive control module is used to detect the brightness value of the current ambient light, and when the brightness value meets the predetermined condition, interrupt the connection between the local cell and the display device, i.e., to stop supplying power to the display device by the local cell, and establish the connection between the solar cell module and the display device, i.e., to start supplying power to the display device by the solar cell module. In this way, it is able to prolong the standby time for the display device and save the cell power of the local cell. In addition, it is able to ensure the normal operation of the display device when the local cell is used up.

Figure 3A:
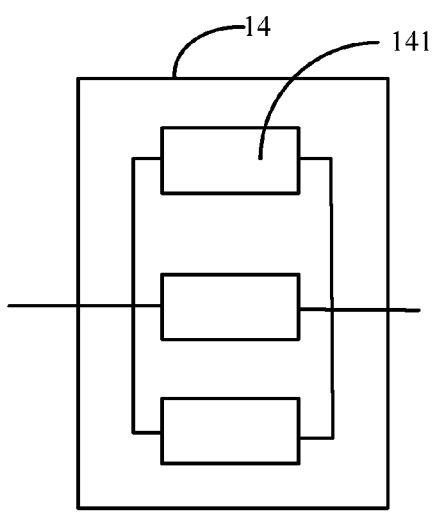
FIGS. 3(a)-3(c) are schematic views showing connection modes for solar cells 141 in a solar cell module 14 according to one embodiment of the present disclosure.
Figure 3B:
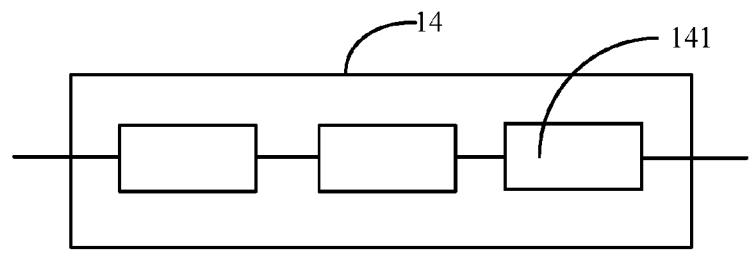
Figure 3C:
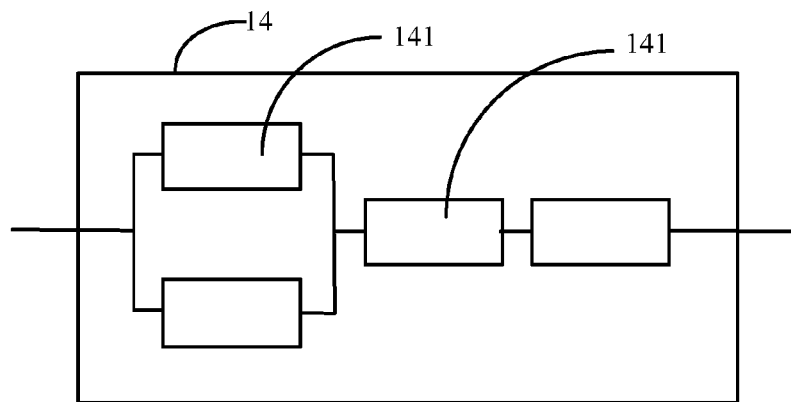

Alternatively, as shown in FIGS. 3(a)-3(c), the solar cell module 14 includes at least two solar cells 141 connected in series and/or in parallel, i.e., the at least two solar cells may be connected in series, in parallel, or in a combination thereof. To be specific, as shown in FIG. 3(a), the solar cell module 14 includes three solar cells 141 which are connected in series. As shown in FIG. 3(b), the solar cell module 14 includes three solar cells 141 which are connected in parallel. As shown in FIG. 3(c), the solar cell module 14 includes four solar cells 141, two of which are connected in parallel and then connected in series to the other two solar cells 141 connected in series. It should be appreciated that, generally, the solar cell module is formed in a laminating manner. One laminating mode is a mechanical laminating mode, where two separate solar cells, i.e., a high-bandwidth solar cell and a low-bandwidth solar cell, are manufactured at first and then the high-bandwidth solar cell is laminated onto the low-bandwidth solar cell. The other laminating mode is an integrally forming mode, where the solar cells are connected in series via a tunnel junction.

Alternatively, the solar cell in the embodiments of the present disclosure may be a single crystalline silicon solar cell, a nanocrystalline solar cell, an organic solar cell, or an electrode-type solar cell modified with multiple polymer layers.

Figure 4:
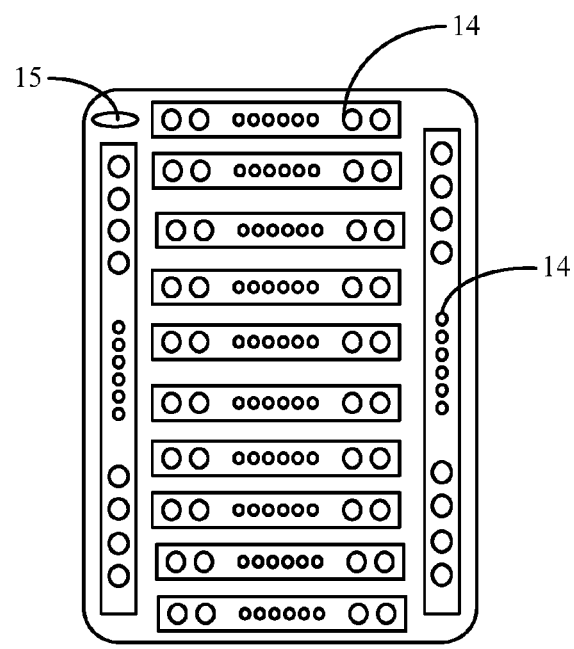
FIG. 4 is a schematic view showing the solar cell module arranged at a surface of a back plate of the display device.

Alternatively, as shown in FIGS. 2 and 4, the solar cell module is arranged at a bezel region of the display panel and/or at a surface of a back plate of the display device.

To be specific, as shown in FIG. 2, the solar cell module is arranged at the bezel region of the display panel. The solar cell module is usually made of a semiconductor material, and when it is of a complex structure, leads may be provided in the solar cell module. Hence, an aperture ratio of the display device may be adversely affected to some extent even when a transparent semiconductor material such as silicon is adopted. In order to ensure the aperture ratio of the display device, the solar cell module may be arranged at the bezel region of the display panel. The bezel region is a region of the display panel other than a display region of the display panel.

When the solar cell module is arranged at the bezel region of the display panel, a film on the bezel region may be designed in one of the following two modes.

Mode 1

Figure 5A:
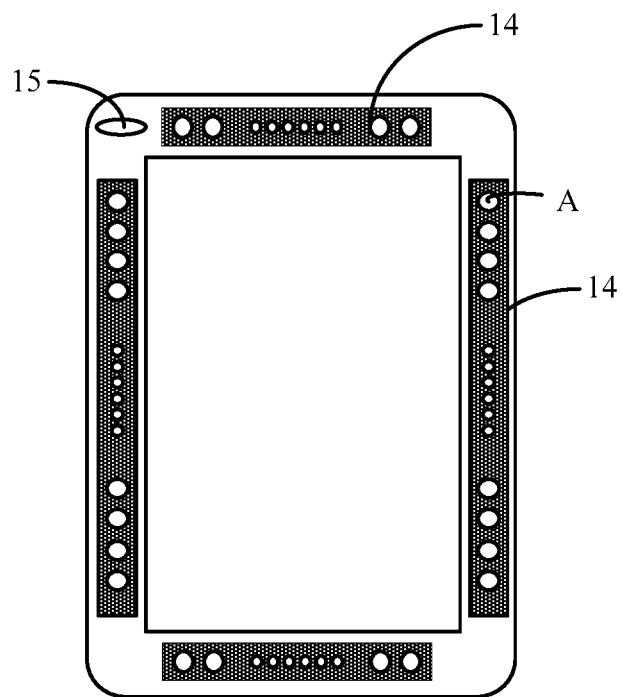
FIG. 5(a) is a schematic view showing the solar cell module arranged at a bezel region.

FIG. 5(a) is a schematic view showing the solar cell module arranged at the bezel region of the display panel. A typical ink-printed film on the bezel region is nontransparent. In order to enable the solar cell module at the bezel region to receive the ambient light, a plurality of apertures A is formed in the ink-printed film by an etching process, so as to expose a portion of the solar cell module. In this way, it is able for the exposed solar cell module to receive the ambient light, convert the light energy into the electric energy, and store the electric energy in the accumulator of the solar cell module.

Mode 2

Figure 5B:
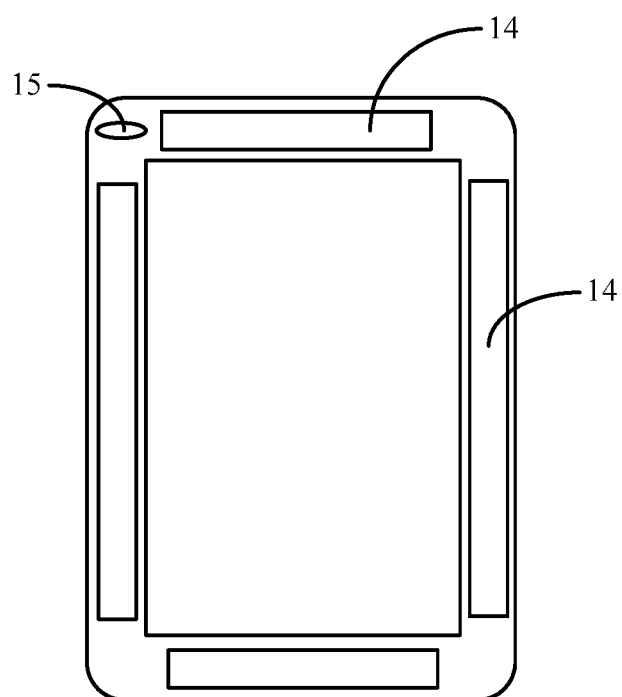
FIG. 5(b) is another schematic view showing the solar cell module arranged at the bezel region.

FIG. 5(b) is another schematic view showing the solar cell module arranged at the bezel region of the display panel according to one embodiment of the present disclosure. In this structure, the ink-printed film coated on the bezel region is a transparent film, so all solar cell modules at the bezel region may receive the ambient light through the transparent film.

It should be appreciated that, the photosensitive control module may be arranged in a similar manner as the solar cell module. To be specific, when the ink-printed film on the bezel region is a nontransparent film, the photosensitive control module may be exposed via the apertures in the film, and when the ink-printed film on the bezel region is a transparent film, the photosensitive control module may directly receive the ambient light, e.g., sunlight, without any need to form the apertures.

FIG. 4 is a schematic view showing the solar cell module arranged at the surface of the back plate of the display device. Actually, in the embodiments of the present disclosure, the solar cell module may be arranged at any positions other than the display region, as long as the aperture ratio of the display device may not be adversely affected. Hence, the solar cell module may also be arranged at the surface of the back plate of the display device. In this way, it is able to prevent the aperture ratio of the display device from being adversely affected, and to provide more solar cell modules as possible so as to increase the electric energy stored by the solar cell module.

Figure 6:
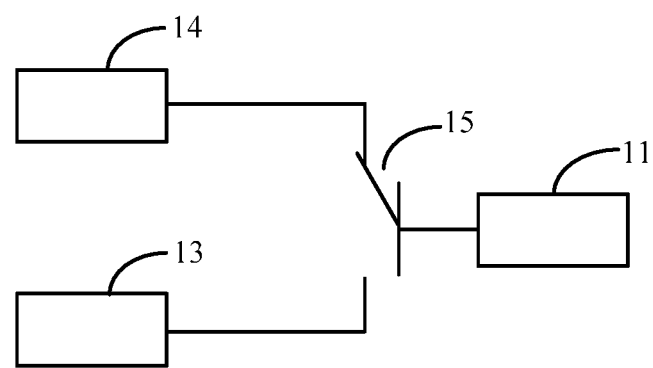
FIG. 6 is a schematic view showing an internal circuit for the display device according to one embodiment of the present disclosure.

Alternatively, as shown in FIG. 6, the solar cell module 14 is connected in parallel to the local cell 13, and connected to the display module 12 and the display panel 11 through the photosensitive control module 15. The photosensitive control module may be a photosensitive control element. Usually, the solar cell module can receive the ambient light, convert the light energy into the electric energy and store the electric energy when the display device is exposed to the ambient light. However, if the power supply of the display device is switched when the detected brightness value is less than a predetermined ambient light brightness threshold, the electric energy converted by the solar cell module from the ambient light in unit time may be less than the electric energy consumed by the display device in the same unit time. After a period of time, the electric energy in the solar cell module may be used up, and it is impossible to ensure the normal operation of the display device. At this time, the power supply of the display device may be switched back to the local cell 13. The display device, especially that is executing a corresponding program or task, may be damaged somewhat when the power supply is frequently switched between the local cell 13 and the accumulator of the solar cell module 14. Hence, in the embodiments of the present disclosure, the predetermined condition is that the brightness value of the ambient light is not less than the predetermined threshold, so as to ensure a stable switching operation. Further, the predetermined threshold is a minimum brightness value of the ambient light when a total amount of the electric energy converted by the solar cell module from the ambient light in unit time is not less than the power consumption of the display device in unit time. In this way, a user may continue to use the display device after the switching operation, and the program or task being currently executed may not be interrupted due to the switching operation. In addition, through the predetermined threshold, it is able to ensure the normal operation of the display device after the power supply of the display device is switched to the solar cell module, save the cell power of the local cell and prolong the standby time for the display device, i.e., to ensure the normal operation of the display device when the electric energy of the local cell is used up.

Alternatively, the photosensitive control element in FIG. 6 may be a photosensitive switch. When it is detected by the photosensitive switch that the brightness value of the current ambient light meets the predetermined condition, the photosensitive switch is turned on and connected to a lead that is connected to the solar cell module 14, and otherwise, the photosensitive switch is turned on and connected to a lead that is connected to the local cell 13.

Figure 7:
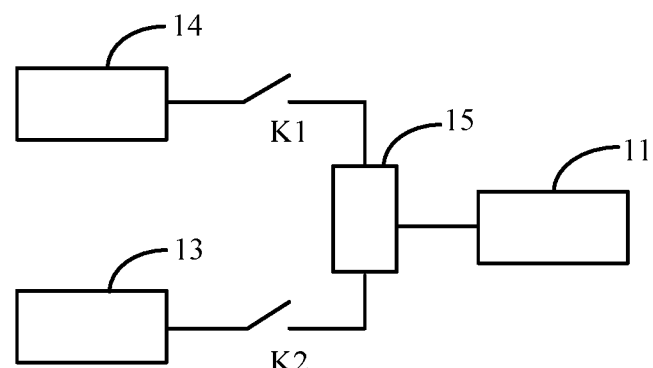
FIG. 7 is a schematic view showing another internal circuit for the display device according to one embodiment of the present disclosure.

Alternatively, as shown in FIG. 7, when it is detected by the photosensitive control element that the brightness value of the current ambient light meets the predetermined condition, a switching element K1 at a side of the solar cell module 14 is controlled to be turned on, and a switching element K2 at a side of the local cell 13 is controlled to be turned off. Otherwise, the switching element K1 at a side of the solar cell module 14 is controlled to be turned off, and the switching element K2 at a side of the local cell 13 is controlled to be turned on. In this way, it is able to achieve the switching operation.

Alternatively, the display panel in the embodiments of the present disclosure may be an OLED display panel.

The display device in the embodiments of the present disclosure may be any product or member having a display function, such as a mobile phone, a flat-panel computer, a laptop computer, a digital camera or a navigator.

Although the embodiments of the present disclosure have been discussed, a person of ordinary skills may modify and polish these embodiments with the inventive principle of the present disclosure. Therefore, the claims should be construed as including the embodiments and all modification and polish falling within the scope of the present disclosure.

It is appreciated that a person of ordinary skills may modify and improve the present disclosure without departing from the spirit and principle of the present disclosure. As a result, if those modification and improvement falls within the scope of claims and the equivalence thereof, those modification and improvement fall within the scope of the present disclosure.

What is claimed is:

1. A display device, comprising:
a body comprising a display panel;
a local cell; and
a solar cell module and a photosensitive control circuit arranged on the body,
wherein the solar cell module is configured to receive ambient light, convert light energy into electric energy, and store the electric energy; and the photosensitive control circuit is configured to detect a brightness value of the ambient light, and switch a power supply of the display device from the local cell to the solar cell module when the detected brightness value meets a predetermined condition;
the solar cell module comprises at least two solar cells connected in series and/or connected in parallel;
the solar cell module is arranged at a bezel region of the display panel; and
an ink-printed film is coated on the bezel region of the display panel, and the ink-printed film is a non-transparent film with a plurality of apertures.

2. The display device according to claim 1, wherein the solar cell module is further arranged at a surface of a back plate of the display device.

3. The display device according to claim 2, wherein the photosensitive control circuit is a photosensitive switch.

4. The display device according to claim 2, wherein the predetermined condition is that the brightness value of the ambient light is not less than a predetermined threshold.

5. The display device according to claim 4, wherein the predetermined threshold is a minimum brightness value of the ambient light when a total amount of the electric energy converted by the solar cell module from the ambient light in unit time is not less than the power consumption of the display device in the unit time.

6. The display device according to claim 2, wherein the display panel is an organic light-emitting diode (OLED) display panel.

7. The display device according to claim 2, wherein the solar cell is a single crystalline silicon solar cell, a nanocrystalline silicon solar cell, an organic solar cell, or an electrode-type solar cell modified with multiple polymer layers.

8. The display device according to claim 1, wherein the photosensitive control circuit is a photosensitive switch.

9. The display device according to claim 8, wherein the predetermined condition is that the brightness value of the ambient light is not less than a predetermined threshold.

10. The display device according to claim 9, wherein the predetermined threshold is a minimum brightness value of the ambient light when a total amount of the electric energy converted by the solar cell module from the ambient light in unit time is not less than the power consumption of the display device in the unit time.

11. The display device according to claim 8, wherein the display panel is an organic light-emitting diode (OLED) display panel.

12. The display device according to claim 8, wherein the solar cell is a single crystalline silicon solar cell, a nanocrystalline silicon solar cell, an organic solar cell, or an electrode-type solar cell modified with multiple polymer layers.

13. The display device according to claim 1, wherein the predetermined condition is that the brightness value of the ambient light is not less than a predetermined threshold.

14. The display device according to claim 13, wherein the predetermined threshold is a minimum brightness value of the ambient light when a total amount of the electric energy converted by the solar cell module from the ambient light in unit time is not less than the power consumption of the display device in the unit time.

15. The display device according to claim 1, wherein the display panel is an organic light-emitting diode (OLED) display panel.

16. The display device according to claim 1, wherein the solar cell is a single crystalline silicon solar cell, a nanocrystalline silicon solar cell, an organic solar cell, or an electrode-type solar cell modified with multiple polymer layers.

* * * * *